United States Patent [19]

Le Jeune

[11] Patent Number: 4,873,445
[45] Date of Patent: Oct. 10, 1989

[54] SOURCE OF IONS OF THE TRIODE TYPE WITH A SINGLE HIGH FREQUENCY EXITATION IONIZATION CHAMBER AND MAGNETIC CONFINEMENT OF THE MULTIPOLE TYPE

[75] Inventor: Claude Le Jeune, Gif Sur Yvette, France

[73] Assignee: Centre National de la Recherche Scientifique, Paris, France

[21] Appl. No.: 273,179

[22] Filed: Nov. 15, 1988

Related U.S. Application Data

[63] Continuation of Ser. No. 97,268, Sep. 17, 1987, abandoned, which is a continuation-in-part of Ser. No. 856,412, Apr. 28, 1986, abandoned.

[30] Foreign Application Priority Data

Apr. 29, 1985 [FR] France .................... 85 06492

[51] Int. Cl.⁴ ........................................... H01J 27/00
[52] U.S. Cl. ............................. 250/432 R; 250/251; 250/492.2
[58] Field of Search .......... 250/423 R, 424, 427, 250/492.21, 492.2, 251, 492.3; 315/111.21, 111.31, 111.41, 111.71, 111.81; 313/360.1, 362.1, 363.1

[56] References Cited

U.S. PATENT DOCUMENTS

| | | | |
|---|---|---|---|
| 3,956,666 | 5/1976 | Reader et al. | 315/111.81 |
| 4,352,974 | 10/1982 | Mizutani et al. | 250/492.21 |
| 4,481,062 | 11/1984 | Kaufman et al. | 156/345 |
| 4,559,477 | 12/1985 | Leung et al. | 250/427 |
| 4,602,161 | 7/1986 | Whealton et al. | 315/111.81 |
| 4,782,235 | 1/1988 | Lejeune et al. | 250/423 R |

FOREIGN PATENT DOCUMENTS

| | | |
|---|---|---|
| 3134337 | 3/1983 | Fed. Rep. of Germany . |
| 0130039 | 7/1985 | Japan .................. 250/423 R |
| 0177180 | 9/1985 | Japan .................. 250/423 R |
| 8600465 | 1/1986 | PCT Int'l Appl. ........... 315/111.91 |
| 2146836 | 4/1985 | United Kingdom . |

OTHER PUBLICATIONS

IBM Technical Disclosure Bulletin, vol. 24, No. 11B, Apr. 1982, 320 Applied Physics Letters, 45 (1984) Jul., No. 2, New York, USA.
RF Multipolar Plasma For Broad and Reactive Ion Beams, Electrostatic Reflex Plasma Source as a Plasma Bridge Neutralizer.

Primary Examiner—Bruce C. Anderson
Attorney, Agent, or Firm—Vorys, Sater, Seymour and Pease

[57] ABSTRACT

An ion source of the triode type is provided having a single ionization chamber, high frequency excitation and magnetic confinement of the multipole type, comprising: a single ionization chamber; an amagnetic cathode forming a capacitor plate and cooled by the flow of a fluid; an amagnetic anode forming at least a part of the wall of the ionization chamber; a circuit for applying a high frequency AC voltage between the cathode and the anode; a third electrode; an arrangement for biasing the third electrode independently with respect to the cathode-anode assembly; a system of alternate magnetic poles adapted for creating a multimirror magnetic configuration about the anode; a gas injection arrangement for injecting at least one gas to be ionized into the chamber; at least one orifice for discharging the gases from the chamber; and a controlled pump for exhausting gases out of the chamber through said at least one orifice.

18 Claims, 5 Drawing Sheets

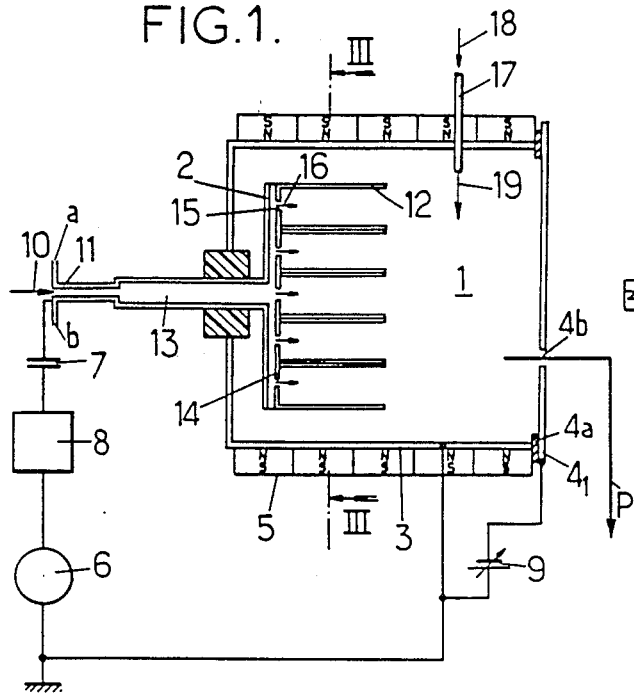
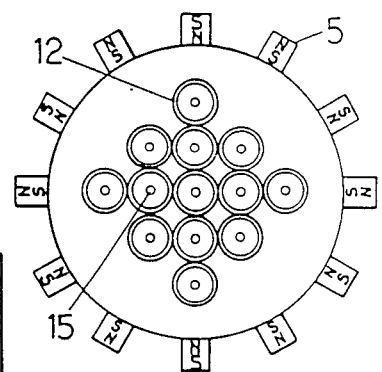
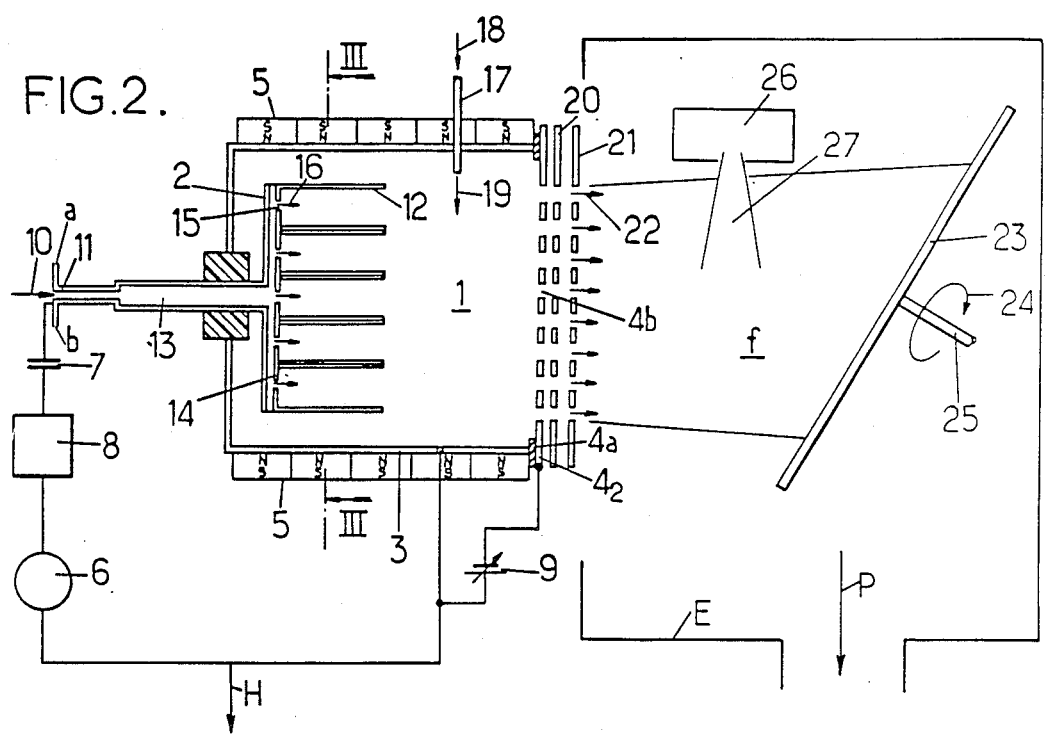

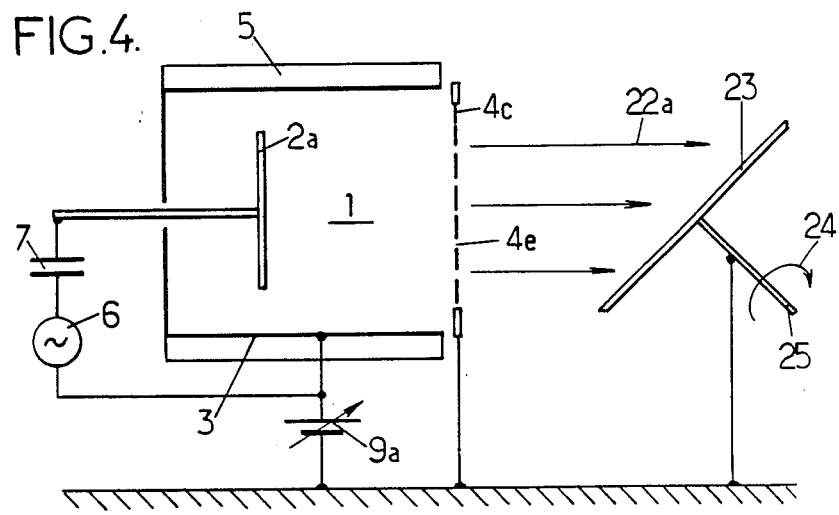
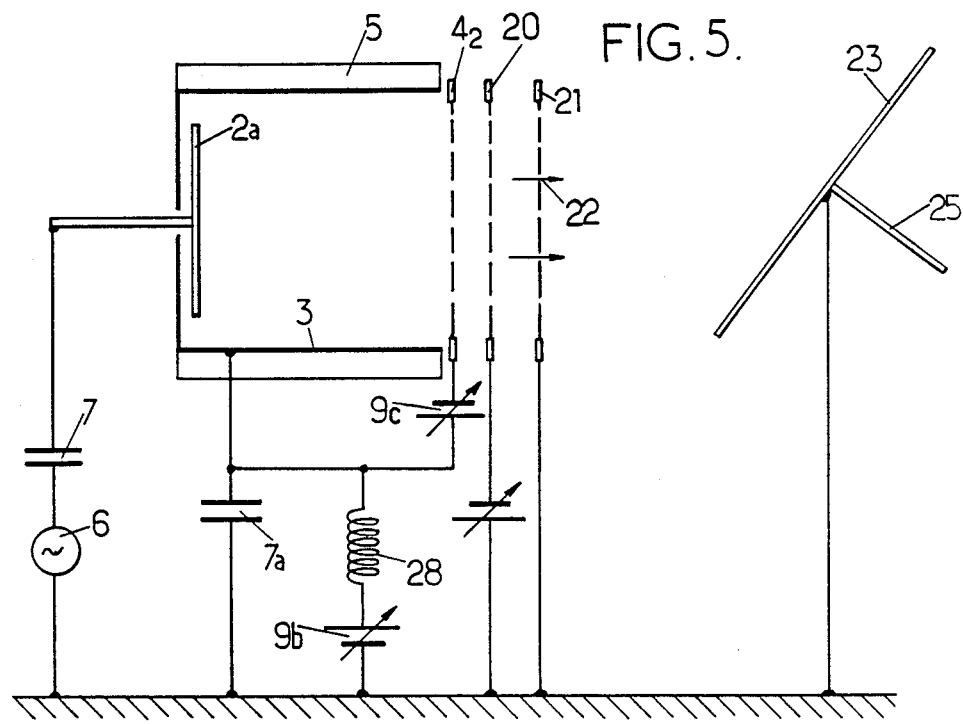

SOURCE OF IONS OF THE TRIODE TYPE WITH A SINGLE HIGH FREQUENCY EXITATION IONIZATION CHAMBER AND MAGNETIC CONFINEMENT OF THE MULTIPOLE TYPE

This application is a continuation of application Ser. No. 07/097,268, filed Sept. 17, 1987 abandoned, which is a continuation of application Ser. No. 856,412, filed 4/28/86 abandoned.

BACKGROUND OF THE INVENTION

The present invention relates to ion sources having a single ionization chamber in which the plasma is created by excitation of a gas by means of a high frequency electric field, for forming either plasmas or ion beams.

Such ion sources prove to be in greater and greater demand, on the one hand, for the mechanical surface treatments of materials, for giving them an increased resistance to corrosion and wear and, on the other hand, for their application in the manufacturing phases of high integration integrated circuits, for example for cleaning the substrates, depositing thin layers (by epitaxy or for forming passivation layers), for the stripping of resins and etching the patterns.

The invention provides an ion source providing wide section beams, uniform over substantially the whole of their section and stable in time, from gases which are chemically reactive either with the materials of the discharge, or therebetween.

The invention aims at providing a satisfactory compromise between the different requirements for such sources, such as a long life span, low pollution, high yield or degree of ionization, simplicity of use and automation, reproducibility.

Ion sources having a single ionization chamber are known using the following techniques:

(A) Ion sources having a single ionization chamber are known in particular whose plasma is created by high frequency excitation by means of an alternating electric field applied between two electrodes disposed opposite each other and of different forms (flat, cylindrical or spherical), depending on the high frequency diode type with capacitive coupling.

This structure is widely used at the present time in plasma technology because of its simplicity and because it is suitable for the ionization of reactive gases, without any problem of durability. On the other hand it has deficiencies in so far as the following are concerned - the uniformity of the plasma; the pollution of a target, carried by the anode, following spraying of the cathode under the impact of the ions; the degree of ionization of the plasma; the maximum operating pressure; the ionization yield is very low; and control of the energy of the ions arriving on one or other of the electrodes, both participating in the creation of the plasma and consequently having no degree of freedom in so far as their biasing is concerned.

Some improvements have been obtained by applying a magnetic field (axial or transversal), but to the detriment of uniformity, and by using an independent biasing circuit with a different frequency for the second electrode.

Such high frequency diodes with capacitive coupling are described for example in the book by Brian Chapman "Glow Discharge Processes" 1980, John Wiley and Son, New York.

(B) Furthermore, ion sources having a single ionization chamber are known whose plasma is created by the application of a static DC electric field between a hot electron emitting filament and an anode forming the walls of the chamber, at the periphery of which magnetic confinement of the multimirror type is provided by means of alternate magnetic poles which give a multipole DC diode structure.

These sources give a dense, uniform and calm plasma over wide sections under good conditions of simplicity, reproducibility and yield; on the other hand, operation with reactive gases proves practically impossible, not only because of the vulnerability of the hot filament, with respect to oxygen in particular, but because of the possible consequences of deposits, in the chamber, of compound gases, (fluorinated or chlorinated), operation with compound gases of the fluorocarbon type leading for example to the extinction of the continuity discharge after only a few hours of operation, during which a permanent drift of the operating point is observed. Moreover, pollution of the targets occurs because of the evaporation, spraying and possible chemical attack of the hot filament.

An ionization source of this type is described in an article by T. D. Mantei and T. Wicker, Appl. Phys. Letters, 43 (1983) 84 and the articles by H. R. Kaufman, J. of Vac. Sc. Technol., 1978, vol. 15, p. 272 and H. R. Kaufman et al, J. of Vac. Sc. Technol., 1982. vol. 21?p. 725.

(C) Ion sources having a single ionization chamber are also known in which the multimirror magnetic confinement is associated with the ionization or excitation of the neutrals by an alternating electric field either of high frequency, or of very high frequency for associating the advantages and reducing the disadvantages which may result from the structures mentioned above under A and B.

Such sources are described for example in the following articles:

E. R. Ault and K. R. MacKenzie, Rev. Sci. Instrum, 44 (1983) 1967,

Fosnight et al, EDB 700205 TEW, Redondo Beach, Ca. (U.S.A.), 1982,

Y. Arnal et al, Appl. Phys. Lett., vol. 45 (1984 p. 132–134.

Similarly, the U.S. Pat. No. 4,481,062 describes an ion source having a multipole magnetic confinement chamber with a hot cathode, heated by DC current or AC current from the mains, and an anode, a DC current source applying a DC potential difference between cathode and anode.

In so far as the multimirror magnetic confinement is concerned, ion sources have also been proposed having two or three ionization chambers, for example in the French patent application No. 2,550,681 filed on the 12th August 1983 by the applicant and publically available since the 15th Feb. 1985, confinement of the ions and of the electrons in the third ionization chamber (when there are three chambers) being obtained by a multimirror magnetic configuration formed by rings or rows of alternate magnetic poles disposed about this chamber.

This type of source is very suitable for operation with chemically reactive gases which do not give rise to isolating deposits, for in such a case excitation by a DC electric field of the plasma of the third chamber has the same drawback as the one described in connection with the sources of type A. In addition, it should be noted that, even if such a possibility is ruled out, the three chamber source thus obtained is goverend by a large number of parameters and that, in exchange for its good performances (uniformity, stability of the plasma and ionization yield), it is more delicate to control and consequently to automate.

The German patent application No. 31 34 337 initially published (DOS) on Mar. 24, 1983 should also be mentioned which describes an ion gun using a high frequency going up to $2 \times 10^6$ kHz between electrodes in the ionization chamber. No magnetic confinement device of the multipole type is provided in this patent application.

Finally, Guarnieri and Kaufman described in IBM Technical Disclosure Bulletin, vol. 24, no 11B, Apr. 1982, p. 5833–5835 (New York) high frequency excitation in a two electrode chamber, also without multipole magnetic confinement.

SUMMARY OF THE INVENTION

The aim of the present invention is to improve the ion sources of the prior art type, particularly the ion sources of the above type C, so as to obtain sources having a very long lifespan - which is a fundamental parameter for industrial application. The invention provides the best compromise between, on the one hand, the criteria characterizing the available ion flow, namely in particular the uniformity and stability over large sections, the absence of pollution by particles or parasite radiation, and the ratio of the ion flow to the flow of neutrons and, on the other hand, the criteria characterizing the ion source, in particular its simplicity to use and automate, and its reliability, which criteria, depending on the specifications of present applications, must be extremized (maximized or minimized depending on the case).

With respect to the source described in the French patent application of the applicant mentioned above, the ion source of the invention provides an appreciable improvement in so far as the simplicity of using and automating is concerned, at the price of a sacrifice concerning the ion flow/neutral flow ratio representing the efficiency of ionization of the source, following an increase of the maximum pressure up to which the discharge may be maintained in the source with a significant charge density.

The ion source of the invention is an ion source with a single ionization chamber in which the plasma is created by the excitation of a gas by means of a high frequency electric field between two electrodes (cathode and anode) and it further comprises a third electrode (of the anticathode or of the screen grid type) with independent polarization and magnetic confinement of the multipole type, i.e., a multimirror type, provided by rings or bands of alternate magnetic poles disposed about this chamber.

More precisely, the invention provides a discharge ion source with a single ionization chamber, comprising in combination, with the single ionization chamber: an amagnetic cathode forming a capacitor plate and cooled by the flow of the fluid, which cathode is disposed inside the ionization chamber in the vicinity of a first end thereof; an amagnetic anode forming at least a part of the wall of the ionization chamber; means for applying between the cathode and the anode a high frequency alternating voltage, this frequency being at least equal to the value of the lower limit frequency from which the plasma of the chamber is permanently ignited in a stationary state of equilibrium independent of time; a third electrode, of the anticathode type or of the screen grid type, disposed at the second end of the chamber opposite the first end; means for biasing the third electrode independently of the cathode-anode assembly; a system of alternate magnetic poles adapted for creating a multimirror magnetic configuration about the anode; means for injecting at least one gas to be ionized into the ionization chamber; at least one orifice for discharging the gases from the ionization chamber; and pumping means controlled for sucking gases out of the ionization chamber through said at least one orifice.

The ion source of the invention may operate in two modes, the first one, called a "plasma ion source", leading to the irradiation of the targets within the plasma itself and the second, called a "beam ion source", leading to irradiation of the targets outside the ionization chamber, in a gas atmosphere with independently controllable pressure.

In the first case, the target to be irradiated by the ions is disposed inside the ionization chamber against the third electrode which is then a solid anticathode (except for the possible orifice for discharging the gases) and the ions are accelerated from the plasma where they are created by the negative voltage applied to the anticathode, which ensures the independence between the intensity of the ion flow and the energy of the ions. On the other hand, the incidence of the ions on the target is practically normal and irradiation takes place at the pressure required for forming the plasma and in a neutral particle atmosphere (molecules or radicals) resulting from the creation of this plasma whose physicochemistry is very often highly complex. In the second case, these last two disadvantages may be eliminated, the targets being placed outside the ionization chamber whose third electrode is then perforated with a large number of openings, forming a so-called screen grid with circular holes or slits, through which the ions of the plasma may be accelerated, then formed into a beam directed towards the target by means of an optical system comprising 0, 1 or 2 additional grids (respectively for acceleration and deceleration in the case of two grids), whose openings are either aligned, or voluntarily offset with respect to that of the screen grid. Downstream of these grids, an electron injection device may be provided which compensates for the positive space charge of the ion beam formed not only in so far as voluminal density (for avoiding break up of the beam under the action of electric forces due to the space charge) but also as far as the current is concerned (if the need is felt, for example in the case of interaction with an isolating target), not allowing flow of the positive charges.

The outside of the ionization chamber is generally placed under atmospheric pressure and elements should then be provided, between the different electrodes, providing both electric isolation and sealing preventing the passage of the gases. It is however possible to place the whole of the ionization chamber in an enclosure where a partial vacuum exists.

The cathode forms one of the plates of a capacitor whose second plate is the anode, these two plates of the capacitor being connected to terminals of the high frequency generator and forming a capacitive coupling which creates the plasma, contrary to what happens in ion sources in which the high frequency potential difference is applied to the terminals of an electrode in the form of an induction coil, coupling then being of the self inductive type (certain ion sources of the above type C).

The cathode may be either of a multitube type, the tubes having for example a circular or rectangular, possibly square section with, in some cases, injection of gases to be ionized by the tubes, or a cathode formed by a flat or curved (particularly cylindrical or spherically shaped) surface.

In the case of a flat cathode, the current density of the ion flow is lower than for a mutlitube cathode, but the self-biasing voltage of the cathode is higher; so, such a form is very favorable for depositing, on the anticathode, a thin layer of particles extracted from the cathode under the impact of the high energy ions coming from the plasma, following a method known under the name of "cathode spraying"; moreover. the fact of giving to the cathode a concave, cylindrical or spherical shape in the direction of the anticathode means that the neutral flow is concentrated on a smaller area of the anticathode and so increases the growth rate of the layer on this restricted area.

On the other hand, if it is desired to obtain a deposit from a plasma phase chemical reaction or elese etching of a target carried by the anticathode, any deposition resulting from spraying of the cathode forms "pollution". For these methods, a multitude cathode is then clearly preferably. For many applications, it will effectively be this structure which will be the best adapted.

Since a plasma contains electrons and ions, but also neutrons, free radicals and photons, which may be active either in the deposit sense, or in the etching sense, the injected gases should be removed as well as those formed within the plasma either in volume, or following interaction with the target i.e., a (charge effect). The flow rate and pressure of the neutrons present in the chamber must be able to be adjusted indpendently. The orifice communicating with the pumping system may be formed either in the anode. or in the anticathode. A regulating valve is advantageously provided in the pumping circuit.

In so far as the optical system of the "beam" ion source is concerned, depending on the energy desired for the ions which irradiate the target, the following are provided:

(a) an optical system with a single grid, formed by a screen grid or anticathode, with a very fine mesh. The anticathode like the target holder is at ground potential and it is the anode-cathode assembly which is brought to the positive potential with respect to the ground (50 to 150V for example); the ions then have low energy on reaching the target, of the order of 50 to 150 eV;

(b) an optical system with two or three grids, for the case where higher energies are desired (for example 150–1500 eV. In this case also the beam and the target are generally at ground potential and the assembly formed by the ionization chamber, its power supplies and the gas and cooling circuits are brought to a high positive voltage (for example 150–1500 V). Hereagain, because of the high frequency excitation. the high frequency generator may be left at ground potential, coupling with a chamber taking place through isolating capactiors, and only the chamber and its mechanical peripherals are brought to a positive potential.

It is possible, with this "beam" ion source configuration, to vary the intensity and the energy of the ion flow independently, to vary the incidence of the ions independently, whereas, in the case of plasma operation, the incidence is normal whatever the slant of the target in the plasma chamber, which is a characteristic of plasmas, to vary the pressure of the neutrals in the reaction chamber; in particular, the pressure may be considerably lowered with a powerful pumping system. A new type of gas (possibly reactive) may also be introduced at the level of the target, after lowering this pressure associated with the neutrals injected into the source.

This beam ion source variant which is rather complicated to use with respect to the "plasma" ion source, offers more possibilitites. It is a process with a future for complex integrated circuits with a very high degree of integration.

The multimirror magnetic confinement is provided by means of permanent magnets of as good a quality as possible, for example cobalt-samarium magnets, having either cylindrical, or parallelepipedic shapes disposed in contact with the walls of the chamber. The walls are amagnetic and of a thickness as small as possible so as not to attenuate the magnetic field of these magnets.

Several possibilities exist for arranging these different magnets in order to create a multimirror magnetic field configuration about a chamber, for example a cylindrical chamber:

arrangement of alternate NORTH and SOUTH poles in two directions, giving the pin point and multiple mirror configuration known in the technique under the name of "point cusp" or "checkerboard" configurations;

arrangement of bands of poles of the same sign, but alternated and parallel to the generatrices of the cylinder, the lines being either discontinuous (broken) or continuous, this latter solution generally giving the best results. Linear multipole mirrors are obtained having a so called "broken line cusp" or "full line cusp" configuration;

arrangement of rings of poles of a same sign, but alternated and perpendicular to the generatices of the cylinder, a so called "ring cusp" configuration.

In this connection, reference may be made for example to an article in Rev. Sci. Instrum., Vol. 44, no 5, June 1973.

BRIEF DESCRIPTION OF THE DRAWINGS

The invention will be clear from the following complement of description and the accompanying drawings.

FIGS. 1 and 2 illustrate, in a sectional view, an ion source of a triode type of the invention with a single ionization chamber, of high frequency excitation and multipole magnetic confinement, respectively designed for the "plasma" ion source mode (FIG. 1) or the "beam" ion source mode (FIG. 2).

FIG. 3 is a section through III—III of FIG. 1 and FIG. 2.

FIG. 4 illustrates, in a simplified sectional view, a variant of the ion source of FIG. 1;

FIG. 5 illustrates, in a simplified sectional view, a variant of the ion source of FIG. 2.

DETAILED DESCRIPTION OF THE INVENTION

Figure 6:
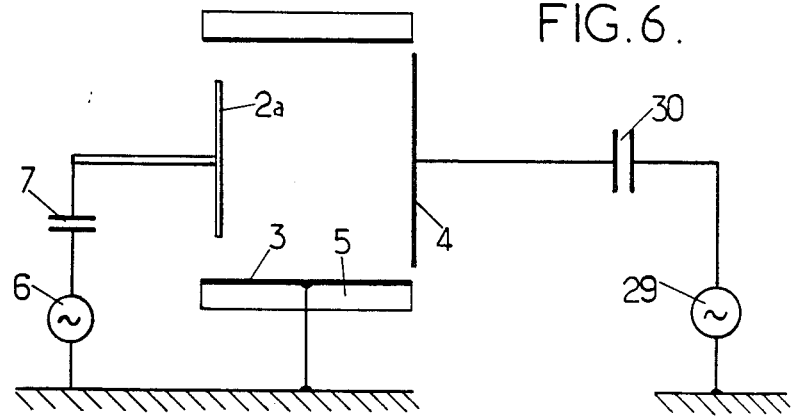
FIG. 6 illustrates schematically a variant of the preceding sources, in which a low frequency alternating voltage is applied between the third electrode and the anode-cathode assembly.

In accordance with the invention, wishing to obtain an ion source of the triode type with a single ionization chamber, high frequency excitation and magnetic confinement of the multipole type, the following or similar is the way to set about it. Reference will be made first of all to FIGS. 1 to 3 which illustrate two multitube cathode embodiments.

FIGS. 1 and 2 illustrate, in axial section, two ion sources of the triode type according to the invention comprising a single ionization chamber, with high frequency excitation and multipole magnetic configuration, FIG. 3 which is a section through III—III of FIGS. 1 and 2 shows precisely the structure for obtaining multipole magnetic confinement.

The embodiment of FIG. 1 is specially designed for operating in the plasma ion source operating mode, whereas FIG. 2 is specially designed for operating in the beam ion source operating mode, as mentioned above.

The part which is substantially common to the two structures of FIGS. 1 and 2 will be described first of all. The ion source of these two Figures comprises first of all a single ionization chamber 1 which is on the one hand evacuated and on the other supplied with gas to be transformed into plasma, as mentioned above.

In the vicinity of one of the ends of chamber 1 is disposed a cathode 2 which, in the embodiments of FIGS. 1 and 2. is formed by a multitude cathode; This cathode 2 is advantageously cooled by the flow of A fluid arriving at a and leaving at b.

Cathode 2 forms one of the plates of a capacitor whose other plate is the anode 3 which forms a large part of the wall of chamber 1.

In addition to the above electrodes 2 and 3, a third electrode is provided formed by a solid anticathode $4_1$, with the possible exception of one or more orifices $4b$ for discharge from chamber 1, as is the case in the source of FIG. 1, or by a screen grid $4_2$, as in the embodiment of FIG. 2. The third electrode $4_1$ or $4_2$ is disposed at the other end of the ionization chamber 1 with respect to the end close to the cathode 2.

An electric isolating and sealing ring 4a is disposed along the periphery of electrode $4_1$, $4_2$ on the ionization chamber 1 side, which allows the whole of chamber 1 to be evacuated if desired.

The magnetic confinement is obtained by means of a system of magnetic NORTH (N) and SOUTH (S) poles 5 which are disposed alternately as shown in FIG. 3.

Other embodiments of the cathode, on the one hand, and of the magnetic confinement system of the multipole type, on the other, are described hereafter more particularly in connection with FIGS. 4, 5, 7 8 and 9.

The two plates, i.e. the cathode 2 and the anode 3 of the above capacitor are subjected to a high frequency voltage which produces a plasma from the gas introduced into chamber 1 by capacitive coupling inside this chamber.

The high frequency is produced by a high frequency generator 6 whose frequency is at least equal to the value of the lower limit of frequency from which the plasma in the chamber is permanently ignited in a stationary state of equilibrium independent of time. This high frequency of the generator 6 is for example greater than 20-50 kHz.

Advantageously, in series with the high frequency generator 6, there is provided a blocking capacitor 7 which eliminates any DC component in the power supply for the cathode 2, and thus any transport of DC current between the cathode 2 and the anode 3. This ensures for the cathode 2 a mean automatic continuous biasing with respect to the anode 3, thus creating electric disymmetry between these two electrodes, in addition to the geometric disymmetry. In the power supply circuit for the cathode 2, an impedance matching circuit 8 may also be provided for improving the power transfer from generator 6 to the electric discharge in chamber 1, by reducing the power reflected by the thus matched impedance.

For providing biasing between the assembly of the electrodes 2 and 3 on the one hand, and the third electrode $4_1$, $4_2$ on the other, in the ion sources of FIGS. 1 and 2, a variable DC voltage source (J) is provided for applying to the anti cathode $4_1$ or to the screen grid $4_2$ a potential chosen a priori with respect to anode 3. This potential is generally of negative value for accelerating the ions.

The supply of gas to be transformed into plasma, that is to say into a mixture comprising essentially negative electrons and positive ions, in chamber 1 by the discharge produced between cathode 2 and anode 3 is provided through cathode 2 which is in this case a hollow cathode. The gas to be ionized is brought, as illustrated by the arrow 10, to the input 11 of the cathode 2. The cathode is in fact formed by several tubes 12, disposed for example as illustrated in FIG. 3, and the distribution of the gas arriving at 10 is obtained by means of a widened portion 13 and a distributor 14. The gas to be ionized finally enters the ionization chamber 1 through the orifices 15 formed at the bottom of tubes 12, as illustrated by arrows 16; and/or The gas supply may alternatively or additionally be provided by means of a gas intake through a duct 17 which passes through the wall of chamber 1 into which the gas to be ionized penetrates in the direction of arrow 18 and leaves in the direction of arrow 19 for reaching chamber 1.

The downstream part of the ionization chamber 1 will now be described, which is different in FIGS. 1 and 2.

In the case of FIG. 1, the anticathode $4_1$ is solid, apart from one or more discharge orifices $4b$ which communicate with a pumping device, preferably adjustable, shown symbolically by the arrow P.

The anticathode $4_1$ may comprise plates forming the targets struck by the ions and also the neutrals (coming for example from spraying of the cathode 2 in the case of a deposit on this cathode) of the plasma formed in chamber 1 by the discharge caused between cathode 2 and anode 3 under the effect of the high frequency generator 6. As mentioned above, this plasma is produced from the gas or gases arriving at 10 and/or at 18.

In the case of the ion source of FIG. 2, behind the screen grid $4_2$ with openings 4b, two additional electrodes are provided forming an extraction assembly, namely an accelerating electrode 20 and a decelerating electrode 21 brought, with respect to the screen grid $4_2$ to negative potential differences. The electrode 20 is more negative than electrode 21. The voltage sources supplying electrodes 20 and 21 have not been illustrated in FIG. 2 because they are conventional; on the other hand, these voltage sources are illustrated in the embodiment of FIG. 5.

Electrodes 20 and 21 are perforated, the ion beam leaving the source through the openings in the decelerating electrode 21, as shown by the arrows 22, and arriving (at f) into an enclosure E evacuated by a pumping system represented by the arrow P. This chamber E forms the reaction chamber in which the target is placed.

In the case of FIG. 2, the target is supported by a plate carrying device 23 which is rotatable, as shown by arrow 24, about an axis 25. It is situated in the independent pumping chamber E in which the pressure Pe may be brought to a level lower than that of Ps which is the pressure in the ionization chamber 1.

Finally, in the embodiment shown in FIG. 2, a plasma neutralizing device 26 is provided sending a plasma jet 27 into the ion beam f between the decelerating electrode 21 and target 23 for compensating the beam of positive ions in voluminal charges and possibly currents.

It can then be seen that the ion source of the invention formed by the common part of FIGS. 1 and 2 allows two different operating modes: namely:

on the one hand (FIG. 1), operation of the ion source for plasma formation (at the pressure of the neutrals equal to the discharge pressure);

on the other hand (FIG. 2), operation of the ion source with formation of an ion beam f propagating in a neutral rarified atmosphere with respect to the case of FIG. 1.

With the two types, i.e., "plasma" and "beam" formation, etching may be provided as, for example, particularly integrated circuit etching, plasma etching in the case of FIG. 1, (type RIE operation: Reactive Ion Etching) and beam reactive etching in the case of FIG. 2 (operation of the RIBE type: Reactive Ion Beam Etching).

In the first case, the etching takes place in the ionization chamber 1 itself by means of the plasma formed in this chamber. Etching very uniform because of the excellent homogeneity of the plasma obtained in the ion source of the invention. The etching is obtained by impact at normal incidence and may then be very anisotropic, which as a general rule is the desired aim.

In the second case, with the ion extraction optical system formed by electrodes 20 and 21, an ion beam f can be drawn from the ionization chamber, and propagated in a rarified atmosphere where Pe is much smaller than Ps. These ions are projected onto the target disposed on the plate carrier 23, wherein the flow and energy of the ions are sufficient for ensuring excellent etching, with the advantage here of being able to modify at will the angle of incidence of the ions on the target.

Variants of the ion sources of FIGS. 1 to 3 will now be described with reference to FIGS. 4 to 9.

FIG. 4 illustrates a variant of the embodiment of FIG. 1, in which the multitude electrode 2 of FIG. 1 has been replaced by a flat electrode 2a.

Furthermore, in FIG. 4, the target carrier 23 is adapted for rotating about the axis 25 in the direction of arrow 24.

FIG. 4 is a schematical Figure in which we find again the multipole assemblies 5. A generator 6 generates the high frequency supplied between the two plates, namely the flat cathode 2a and anode 3, of the capacitor forming the capacitive coupling in the ionization chamber 1, and capacitor 7. The optional impedance matching circuit 8 of FIG. 1 has on the other hand not been shown.

Another difference in FIG. 4 with respect to the embodiment of FIG. 1 is the fact that the third electrode is a screen grid 4c letting the ion beam 22a pass through its very fine mesh 4e.

In FIG. 4, neither the evacuated enclosure nor the pumping source have been shown, which may be similar to those of the ion source illustrated in FIG. 2.

It will be noted that the screen grid 4c like the target carrier 23 are placed at ground potential, The anode 3-cathode 2a assembly is brought to a positive potential with respect to the ground by source 9a which may apply a potential variable for example between 50 and 150V with respect to ground. In this case, the ions have low energy on reaching the target, which energy is of the order of 50 to 150 eV.

Whereas FIG. 4 shows, opposite a flat cathode 2a, a single grid optical system, namely the screen grid 4C, FIG. 5 which is a variant of FIG. 2 shows an optical system with several grids, namely several grids still with a flat cathode 2a.

In FIG. 5, we find again the screen-grid $4_2$, the accelerating grid or electrode 20 and the decelerating grid or electrode 21, the ion beam leaving as beam 22.

Like FIG. 4, FIG. 5 is a simplified FIG. in which the magnetic pole system 5 has not been shown. This system surrounds anode 3.

Similarly, the evacuated enclosure E of FIG. 2 has not been shown in which is disposed the rotary target carrier 23 carried by a shaft 25.

In FIG. 5, we find again capacitor 7 and the high frequency generator 6, this generator being at ground potential, whereas in the embodiment of FIG. 2 a high voltage is applied between ground and the generator 6.

It is because of the isolating capacitor 7 and 7a that connection of generator 6 to the ground is possible, in the case of FIG. 5, coupling with the chamber being provided through these isolating capacitors 7, 7a.

Instead of the single variable potential source 9 of FIG. 2, in the embodiment of FIG. 5 two sources 9b and 9c have been provided between which is disposed a self induction coil 28 for blocking the high frequency.

In the ion sources of FIGS. 1 to 3, on the one hand, and the variants shown in FIGS. 4 and 5 on the other, DC biasing has been used for the third electrode (anticathode or screen grid).

Whereas the high frequency biasing created by generator 6 serves for creating the plasma in the ionization chamber 1, biasing of the third electrode serves for attracting the ions formed in this plasma and communicating thereto the desired energy for interaction with the target, carried by the target carrier 23 or by the third electrode. Their flow ($I^+{}_{AK}$) over the whole of the anticathode or screen grid is practically not modified by the value of the voltage applied to this third electrode. This is the advantage of the "triode" structure which allows both the flow and energy of the ions which act on a target carried by this third electrode to be fixed independently, in the case of the invention. For this configuration, DC biasing may be provided, but also in a variant, biasing by an auxiliary AC voltage whose frequency may be low (a few kilohertz), the plasma being created in another way, for the cases where the target is a dielectric or if the layer formed is itself dielectric in nature. In fact, DC biasing is then inoperative; so the variant in which the third electrode is negatively biased with respect to the anode and to the cathode is more widely used, to be formed as shown schematically in FIG. 6.

In this FIG. 6, instead of DC biasing of the third electrode, biasing is provided by an auxiliary AC voltage of a frequency equal to a few kHz. Hereagain, there may be used for example a flat cathode 2a, an anode 3, a third electrode designated 4 which may be of the screen grid or anticathode type, a pole system 5, a high frequency generator 6 and a capacitor 7. The low frequency AC generator, at a frequency of a few kHz (for example 1 to 10 kHz), is illustrated at 29. A capacitor 30 is placed in series with generator 29 between the ground and electrode 4.

The arrangement of FIG. 6 is more general in so far as the application is concerned, since it is equally suitable for dielectric targets or for the layers formed of a dielectric nature.

It will be noted that the use of an AC generator such as 29, with a blocking capacitor 30, is also applicable by way of variant of FIG. 2. That is to say, when an accelerating electrode 20 and a decelerating electrode 21 are provided, the energy is communicated to the ions by these latter electrodes. The generator 29-capacitor 30 assembly is in this case connected to the screen grid 42 instead of the DC generator 9. In other variants of FIG. 2, electrode $4_2$ could be either connected to anode 3, or left floating, i.e., connected to the anode by a high valve resistance. These last two variants may also be applied to an ion source of the type illustrated in FIG. 1.

Figure 7:
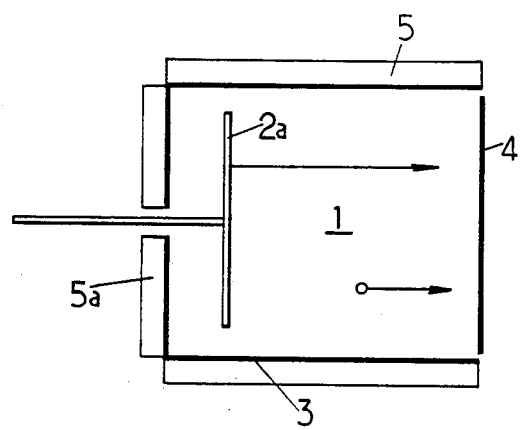
FIGS. 7 and 8 illustrate, schematically and in section, ion sources with other methods of forming the cathode, namely, a flat cathode in the case of FIG. 7 and a cylindrical or spherical cathode in the case of FIG. 8 than that of the ion source shown in FIGS. 1 to 3.

FIG. 7 illustrates another flat anode variant 2a, in which, in addition to the magnet system 5, a second system is also provided of magnets 5a disposed against the end of the ionization chamber 1 the nearest to cathode 2a, and thus on the same side as the end opposite the end closed by the third electrode 4 (of type $4_1$ or $4_2$).

The different magnet systems usable will be described hereafter with reference to FIG. 9.

Up to now, two types of cathodes have been used, namely multitube cathodes (FIGS. 1 to 3) or flat cathodes (FIGS. 4 to 7).

Figure 8:
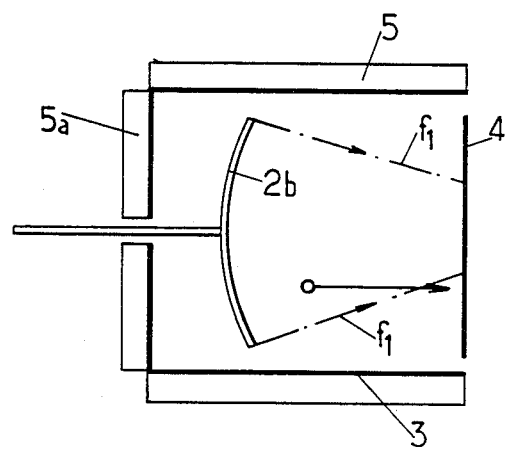

A curved cathode may also be used, as shown in FIG. 8, in which the cathode is referenced 2b. In FIG. 8, the other elements of FIG. 7 are also found.

The advantage of a curved cathode of the spherical or cylindrical type is that it focuses to a greater or lesser extent the neutrals sprayed from this cathode, in the direction of the third electrode 4. This is illustrated by arrows $f_1$ defining the ion beam produced by cathode 2b whose concavity is directed towards the third electrode 4.

It will be noted that a multitube cathode with or without injection gas (in FIGS. 1 and 2 such cathodes have been shown with a gas intake 10 and outlet at 16) has the following advantages with respect to a flat or concave cathode:
 the ion flow is more intense on the anticathode;
 the self biasing voltage of the cathode is lower, thus there is less spraying and so less pollution.

It is then an embodiment which is suitable for application of an ion source of the invention to etching, to chemical deposition within the plasma volume, to oxidization, and to nitridation.

On the other hand, if it is desired to deposit on the anticathode neutrals sprayed from the cathode, with possibly deposition of neutrals formed in volume and the whole being assisted by ionic bombardment on the target, the flat or concave cathode embodiment is more suitable.

Figure 9:
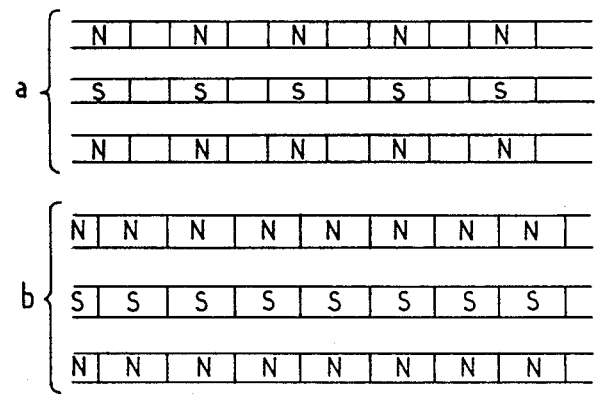
FIG. 9 illustrates two embodiments of a multipole structure forming linear multipole mirrors.

FIG. 9 illustrates two embodiments A and B of linear multiple mirrors formed by strips or rows of NORTH (N) and SOUTH (S) poles. The strips of poles are either broken (embodiment A of FIG. 9) or continuous (embodiment B of FIG. 9).

Instead of the strips parallel to the generatrices of the ionization chamber 1 (an arrangement of the "line cusp" type), rings may be provided perpendicular to the generatrices (an arrangement of the "ring cusp" type). The rings are also either of the broken type, or of the continuous type.

Finally, point multiple mirrors may also be provided for providing the magnetic confinement. These mirrors are of the "point cusp" type or of the "checkerboard" as illustrated respectively in FIGS. 1 and 6 of the Rev, Sci. Instrum., Vol. 44, no 6, June 1973.

In summary, it can then be seen that within the invention may be finally used:
 cathodes of different types, particularly cathodes of the type illustrated in FIGS. 1 to 3, in FIGS. 4 to 7, and finally in FIG. 8;
 third electrodes of the anticathode or screen grid type, with possibly one or more additional electrodes behind the screen grid, such as electrodes 20 and 21 of FIGS. 2 and 5;
 DC or AC biasing of the third electrode; and
 different types of magnetic systems for providing multipole magnetic confinement.

Figure 10:
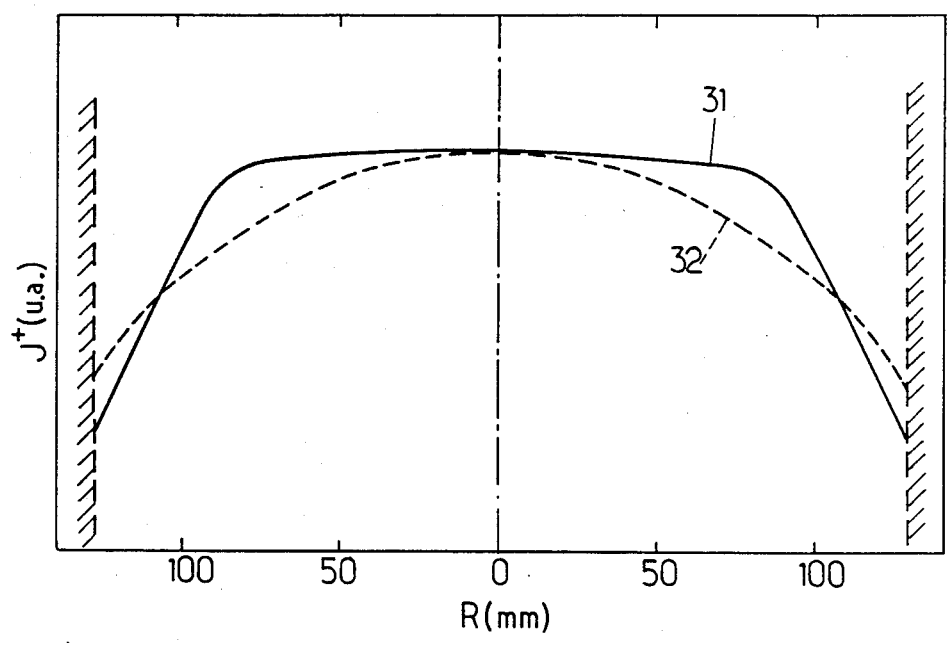
FIG. 10 is a graph showing the improvement, concerning the profile of the current density of the ion flow which irradiates the anticathode, obtained with an ion source of the invention, compared with a similar ion source but without multipole magnetic confinement.

FIG. 10 illustrates the advantage of the multipole magnetic confinement which is one of the features of the invention. In this FIG. 10, there has been shown in abscissa, from the central axis O, the radius R in millimeters from this axis and in ordinates the current density $j+$ in arbitrary units of the flow of ions irradiating the anticathode of an ion source of the invention in which the high frequency generator operates at a frequency of 30.56 MHz and of a source not in accordance with the invention.

The continuous line curve 31 corresponds to the case of multipole magnetic confinement of the invention, whereas the broken line curve 32 illustrates the variation of the profile of the current density for the same ion source, but in which magnetic confinement is not used.

It will be readily seen that the profile of curve 31 is improved with respect to the profile of curve 32 because a relatively constant current density is obtained over a relatively large diameter by the use of multipole magnetic confinement. It will be noted that the two curves 31 and 32 have been standardized for the same maximum value of the current density j+ of the flow of ions irradiating the anticathode.

Figure 11:
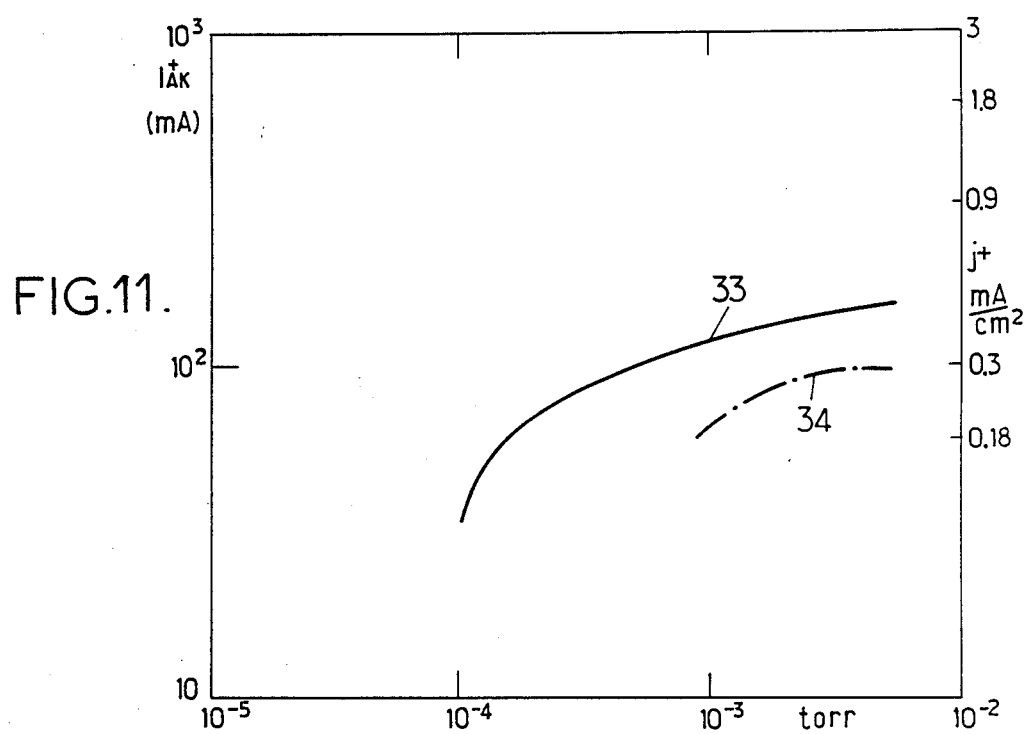
FIG. 11 illustrates the variation of the current density (in mA/cm$^2$) of the ion flow (in mA) irradiating the central part of the cathode as a function of the discharge pressure (in torrs) for two types of ion sources, namely a source of the invention with multipole confinement by bands of alternate poles (with continuous lines) and a similar source but without charge confinement (broken lines).

In FIG. 11, the continuous line curve illustrates the characteristics of an ion source in accordance with the invention and the broken line curve 34 illustrates a similar ion source but in which there is no confinement about the ionization chamber, the alternate magnetic pole lines being omitted.

In FIG. 11, the discharge pressures (in torrs) have been shown as abscissa and the current densities j+ (in mA/cm$^2$) of the flow of ions I+$_{AK}$ (in mA) irradiating the anticathode have been shown as ordinates, FIG. 11 shows that the current densities of ions of a source of the invention, although less than the values obtained for a DC excitation in a tetrode or a pentode according to the above mentioned patent application of the applicant, are compatible for example with the criteria required for reactive ion etching not only with plasma of the IRE type but also with a beam of the RIBE type. In fact, in both cases, it requires current densities between 0.5 and 1mA/cm$^2$, which value may be reached and even exceeded by the ion source of the invention for discharge pressures between 10$^{-4}$ and 10$^{-3}$ torr and adequate high frequency powers between 500 and 1000 watts.

The possibility of working at low pressure is interesting for plasma RIE etching, for the pressure of the neutrals affects the quality of the etching at submicronic dimensions (anisotropie). As for RIBE operation, it involves a low pressure in the chamber if it is desired to obtain a sufficiently low pressure (a few 10$^{-5}$ torr) in the reaction enclosure without using cumbersome and expensive pumps of very high capacities; the ion source of the invention complies perfectly with these two criteria, and better than the high frequency sources or ultra high frequency sources of the prior art.

Figure 12:
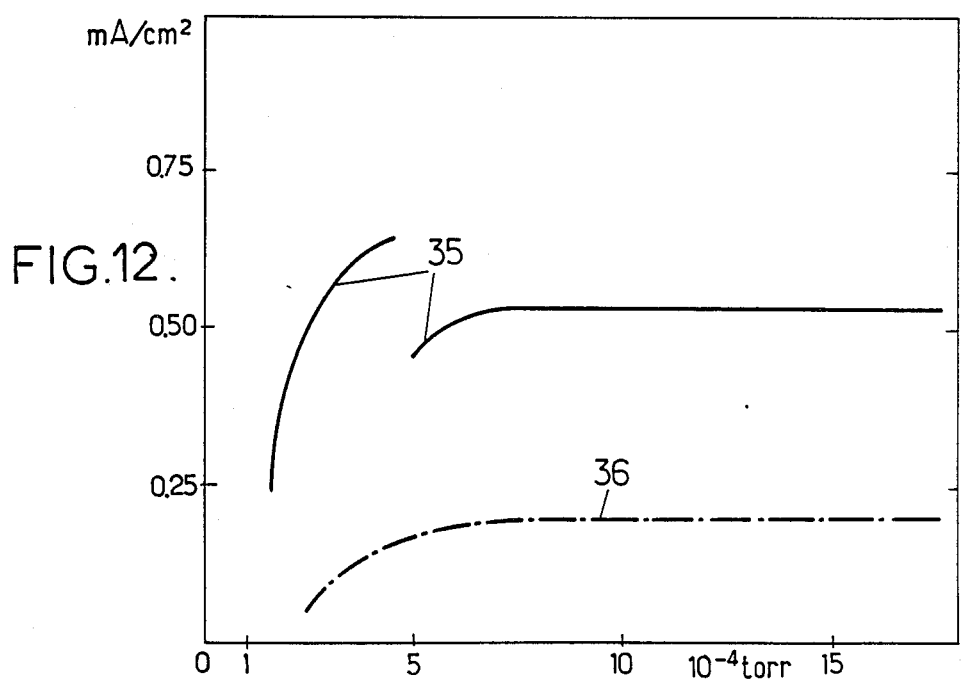
FIG. 12, shows the variation of the current density of the ion flow (in mA/cm$^2$), in the central part of the cathode, as a function of the $CF_4$ pressure in the discharge (in $10^{-4}$ torr) for a source of the invention with respectively either a cathode formed by several tubes or a flat cathode.

FIG. 12 illustrates the variation of the current density of the flow of ions (in mA/cm$^2$) plotted as ordinates, as a function of the CF$_4$ pressure (carbon tetrafluoride) introduced into the ionization chamber in the discharge (in 10$^{-4}$torr) plotted as absicssa, for a source of the invention, one with a cathode formed of several tubes (continuous line curve 35, and the other similar but comprising a flat cathode (broken line curve 36). The improvement obtained in so far as the flows are concerned can be readily seen. In both cases, the incident high frequency power is 300 watts. There is no problem of durability for the source which is insensitive to possible isolating deposits on the electrodes.

Finally the invention allows an ion source to be formed adapted for use either with plasma formation or with beam formation and giving full satisfaction in that it has a long life span, the homogeneity of the plasma is very good, the fragmentation of the injected gases is average, the ionization efficiency is average and the limited pressure is of the order of 10$^{-4}$ torr, and this in a relatively simple structure, with easy supply of the electrodes and automation simplified by the small number of independent parameters.

The ion source of the invention is particularly suitable for etching, particularly integrated circuits, using carbon tetrafluoride and possibly other reactive gases of the fluorocarbonated or chlorocarbonated type, possibly mixed with oxygen.

Such an ion source in fact finds applications in the following techniques using chemically reactive ion flows (formed from oxygenated, nitrogenated, fluorinated or chlorinated compounds for example): integrated circuit technology with high integration for the processes such as oxidization of the semiconductors, etching of the integrated circuits by a reactive ion beam, nitridation of the semicondcutors, deposition of thin layers by epitaxy, removal of the resin masks and treatment of different materials (tools in particular).

As is evident and as it follows moreover already from what has gone before, the invention is in no wise limited to those of its modes of application and embodiments which have been more especially considered: it embraces, on the contrary, all variants thereof.

What is claimed is:

1. A discharge ion source with a single ionization chamber, comprising in combination with a single ionization chamber: an amagnetic cathode forming a capacitor plate and cooled by a flow of fluid, which cathode is disposed inside the ionization chamber in the vicinity of a first end thereof; an amagnetic anode forming at least a part of a wall of the ionization chamber; means for applying between the cathode and the anode a high frequency AC voltage, said frequency being at least equal to the value of the lower limit frequency from which the plasma of the chamber is permanently ignited in a state of stationary equilibrium independent of time; a third electrode disposed at a second end of the chamber opposite a first end; means for biasing the third electrode independently with respect to an assembly of the cathode and the anode; a system of alternate magnetic poles for creating a multi-mirror magnetic configuration about the anode; means for injecting at least one gas to be ionized into the ionization chamber; at least one orifice for discharging gases from the ionization chamber; and pumping means controlled for exhausting gases from the ionization chamber through said at least one orifice.

2. The ion source as claimed in claim 1, wherein said high frequency AC voltage is higher than 20 kHz.

3. The ion source as claimed in claim 1, further comprising a capacitor in series with said high frequency applying means between the cathode and the anode, and an impedence matching circuit in series with said high frequency applying means and the capacitor between the cathode and the anode.

4. The ion source as claimed in claim 1, wherein said cathode comprises a plurality of tubes.

5. The ion source as claimed in claim 4, further comprising means for injecting said tubes at least one gas to be ionized in the chamber.

6. The ion source as claimed in claim 1, wherein said cathode is flat.

7. The ion source as claimed in claim 1, wherein said cathode is concave, its concavity being directed towards the third electrode.

8. The ion source as claimed in claim 1, wherein said third electrode is a solid anticathode, except for gas discharge holes and disposed so as to close said second end of said ionization chamber, samples being applied against the anticathode inside the ionization chamber whose discharge creates the plasma, the particles of which (photons, electrons, neutrals and ions) are used to process target material according to the plasma method for material processing.

9. The ion source as claimed in claim 1, wherein said third electrode is a screen grid for letting the ions of the plasma pass, a target being placed in a reaction chamber independent of the ionization chamber, whose discharge creates the plasma, the ions of which are fomred into a beam in a downstream low pressure chamber in order to process target material according to a conventional ion beam method for material processing.

10. The ion source as claimed in claim 9, further comprising means for accelerating the ions passing through the screen grid so as to form a beam directed towards the target.

11. The ion source as claimed in claim 10, wherein said means for accelerating the ions comprises an accelerating grid and a decelerating grid, the ions finally escaping through said decelerating grid before reaching the target.

12. The ion source as claimed in claim 9, wherein means are provided for compensating the charge and the current of the beam of positive ions leaving the ionization chamber and arriving in the reaction chamber in which the target is placed.

13. The ion source as claimed in claim 1, wherein said third electrode is biased, with respect to the cathode-anode assembly, by an AC generator whose frequency is very much less than the high frequency applied between the anode and the cathode.

14. The ion source as claimed in claim 1, wherein said third electrode is biased, with respect to the cathode-assembly, by a DC voltage source.

15. The ion source as set forth in claim 1, wherein said third electrode is of the anticathode type.

16. The ion source as set forth in claim 1, wherein said third electrode is of the screen-grid type.

17. The ion source as claimed in claim 1, further comprising a capacitor in series with said high frequency applying means between the cathode and the anode.

18. The ion source as claimed in claim 1, wherein said third electrode is a solid anticathode, disposed so as to close said second end of said ionization chamber, the samples being applied against the anticathode inside the ionization chamber whose discharge creates the plasma, the particles of which (photons, electrons, neutrals and ions) are used to process target material according to a plasma method for material processing.

* * * * *